US011112458B1

(12) United States Patent
Schat (10) Patent No.: US 11,112,458 B1
(45) Date of Patent: Sep. 7, 2021

(54) TESTING AN INTEGRATED CIRCUIT HAVING CONSERVATIVE REVERSIBLE LOGIC

(71) Applicant: NXP B.V., Eindhoven (NL)

(72) Inventor: Jan-Peter Schat, Hamburg (DE)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/999,419

(22) Filed: Aug. 21, 2020

(51) Int. Cl.
*G01R 31/3177* (2006.01)
*G01R 31/3185* (2006.01)
*G01R 31/317* (2006.01)
*H03K 3/037* (2006.01)
*H03K 19/20* (2006.01)

(52) U.S. Cl.
CPC ... *G01R 31/3177* (2013.01); *G01R 31/31727* (2013.01); *G01R 31/318525* (2013.01); *H03K 3/037* (2013.01); *H03K 19/20* (2013.01)

(58) Field of Classification Search
CPC ........ G01R 31/3177; G01R 31/318525; G01R 31/31727; H03K 3/037; H03K 19/20
See application file for complete search history.

(56) References Cited

U.S. PATENT DOCUMENTS

2004/0246028 A1* 12/2004 Lee .................... H03K 19/1736
326/104

OTHER PUBLICATIONS

Rupali et al, "Ultra Low Power Reversible Dual Edge Triggered Flip Flop-Design and Implementation", Micro-Electronics and Telecommunication Engineering (ICMETE) 2018 2nd International Conference on, pp. 264-270, 2018. (Year: 2018).*
J. E. Rice, "A new look at reversible memory elements," 2006 IEEE International Symposium on Circuits and Systems, 2006, pp. 4 pp.-, doi: 10.1109/ISCAS.2006.1692817. (Year: 2006).*
M. Prasanna and S. Amudha, "Implementation of testable reversible sequential circuit on FPGA," 2015 International Conference on Innovations in Information, Embedded and Communication Systems (ICIIECS), Coimbatore, India, 2015, pp. 1-5. (Year: 2015).*
Altun et al.: "Exploiting Reversible Computing for Latent-Fault-Free Error Detecting/Correcting CMOS Circuits", Received Sep. 25, 2018, accepted Nov. 19, 2018, date of publication Nov. 30, 2018, date of current version Dec. 27, 2018. Digital Object Identifier 10.1109/Access.2018.2883833, IEEE Access, vol. 6, 2018, pp. 74475-74484.

(Continued)

*Primary Examiner* — Cynthia Britt (57) ABSTRACT

During a test for integrated circuit aging effects, contents of a first set of flip flop circuits are transferred to a second set of flip flop circuits. A first test value is applied to inputs of a combinatorial logic circuit and outputs from the combinatorial logic circuitry are provided to inputs of the first set of flip flop circuits. The combinatorial logic circuitry is reversible and conservative. The outputs from the first flip flop circuits are compared to the first test value to determine if there is a match. A second test value is applied to the inputs of the combinatorial logic circuitry and the outputs from the combinatorial logic circuitry are provided to inputs of the first set of flip flop circuits. The outputs from the first flip flop circuits are compared to the second test value to determine if there is a match, and when the test mode finishes, contents of the second set of flip flop circuits are transferred to the first set of flip flop circuits.

20 Claims, 5 Drawing Sheets

(56) References Cited

OTHER PUBLICATIONS

Feinstein et al.: "Prefix Parallel Adder Virtual Implementation in Reversible Logic", 2007 IEEE Region 5 Technical Conference, Apr. 20-21, Fayetteville, AR, IEEE, 2007, pp. 74-80.
James et al.: "Quick Addition of Decimals using Reversible Conservative Logic", 15th International Conference on Advanced Computing and Communications, IEEE, 2007, pp. 191-196.
Rakesh: "Performance Comparison of 8 bit & 32 bit Logarithmic Barrel Shifter using Fredkin & SCRL gates", Proceeding of Second International conference on Circuits, Controls and Communications, 2017 IEEE, pp. 1-4.
Swaminathan et al.: "Concurrent Testing of VLSI Circuits Using Conservative Logic", IEEE, 2019, pp. 60-65.
Thapliyal et al.: "A New CRL Gate as Super Class of Fredkin Gate to Design Reversible Quantum Circuits", IEEE, 2013, pp. 1067-1070.

* cited by examiner

FIG. 1A
PRIOR ART

| A | B | C | X | Y | Z |
|---|---|---|---|---|---|
| 0 | 0 | 0 | 0 | 0 | 0 |
| 0 | 0 | 1 | 0 | 1 | 0 |
| 0 | 1 | 0 | 0 | 0 | 1 |
| 0 | 1 | 1 | 0 | 1 | 1 |
| 1 | 0 | 0 | 1 | 0 | 0 |
| 1 | 0 | 1 | 1 | 0 | 1 |
| 1 | 1 | 0 | 1 | 1 | 0 |
| 1 | 1 | 1 | 1 | 1 | 1 |

TESTING AN INTEGRATED CIRCUIT HAVING CONSERVATIVE REVERSIBLE LOGIC

BACKGROUND

Field

This disclosure relates generally to test, and more specifically, to testing an integrated circuit having conservative reversible logic.

Related Art

In certain applications, ensuring fail-safe integrated circuit (IC) operation is key, especially when a device failure can endanger human life. Failures in the field (post manufacture and assembly) are mostly due to aging, with the most critical aging mechanism being Bias Temperature Instability (BTI) in which charge carriers enter a metal oxide semiconductor field effect transistor's (MOSFET's) gate, resulting in threshold voltage (Vt) changes which reduce the speed of the transistor. Both p-type and n-type MOSFETs are affected by BTI stresses. For a p-type MOSFET, a logic zero at its gate causes BTI stress (resulting in a forward shift of the Vt) while a logic one causes BTI recovery (resulting in a backwards shift of the Vt, back towards its initial value). The same effects occurs on an N-type MOSFET, except that a logic one at its gate causes BTI stress and a logic zero causes BTI recovery.

In complementary metal oxide semiconductor (CMOS) circuits, both p-type and n-type MOSFETS are used to construct logic gates, and the BTI stresses on the devices affect propagation time of signals through the logic gates. Furthermore, BTI stresses (and thus Vt shifts) typically affect clock paths and data paths differently, which may result in a race condition between clock and data, causing violations in setup or hold times in the flop-flops at the end points of these data and clock paths. These violations can result in operation failure of the IC.

Some ICs require high levels of reliability and safety, and currently, Dual Mode Redundancy (DMR) or Triple Mode Redundancy (TMR) can be used to ensure fail-safe IC operation. With DMR or TMR, two or three identical modules run concurrently. However, since the modules are identical, the BTI stress, BTI recovery, possible BTI-caused racing with the resulting setup/hold violations affect all the identical modules in a similar way, in which a BTI-caused failure may remain undetected/uncorrected. Therefore, while DMR and TMR can reduce the risk of failure during operation, they cannot completely rule it out under all possible circumstances. Therefore, a need exists for improve IC testing which can reliably identify BTI-related violations.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Some ICs include circuitry which may be considered reliability-critical logic in which fail-safe operation is needed. These ICs can be used, for example, in security applications or in health or automotive applications in which a failure of the IC can endanger human life. For example, an IC used for a heart pacemaker may include such reliability-critical logic. In one aspect, such reliability-critical logic is implemented using conservative reversible logic. The use of conservative reversible logic offers the possibility of 100% transition fault coverage, thus resulting in full detectability of all possible setup and hold violations of all clock and data paths. In one embodiment, a self-test of BTI-related setup and hold violations is performed while the device is in use by using extended flip-flops in combination with the conservative reversible logic, which allows the IC to achieve 100% stuck-at fault coverage and 100% transition fault coverage. Furthermore, this coverage can be achieved with the application of just two test vectors to the conservative reversible logic.

Figure 1A:
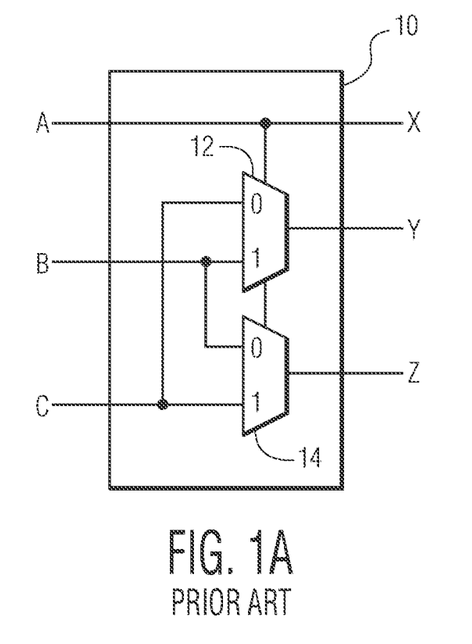
FIG. 1A illustrates, in schematic form, a known Fredkin gate.
Figure 1B:
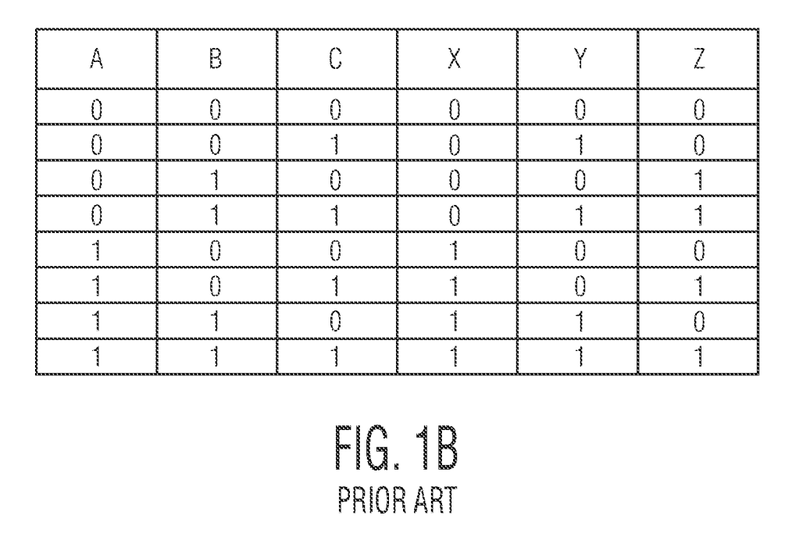
FIG. 1B illustrates a truth table corresponding to the Fredkin gate of FIG. 1A.

FIGS. 1A and 1B illustrate an example of a conservative reversible gate, known as a Fredkin gate. A conservative gate is defined as a gate that has the same number of signals in a logic one state at the output and at the input. Conservative gates can be used to build conservative combinatorial logic, which correspondingly has the same number of logic ones at the output and the input. Reversible gates also have the same number of outputs and inputs, and additionally, they have a bijective transfer function, meaning that one can conclude unambiguously the gate's inputs from the outputs. Note that, for example, an AND gate does not have a bijective transfer function because an output of a logic zero can be a result of different combinations of inputs (e.g. any set of inputs where at least one input is a zero). A reversible circuit is constructed from reversible gates which are connected without fanouts and without feedback loops.

The conservative and reversible properties are independent from each other. That is, conservative logic is often, but not necessarily, reversible, and reversible logic is mostly not conservative. Combinatorial logic which is both conservative and reversible is referred to as conservative reversible logic. Conservative reversible logic in standard CMOS circuitry is often realized using Fredkin gates. FIG. 1A illustrates a Fredkin gate 10, which includes multiplexers (MUXes) 12 and 14. Fredkin gate 10 has three inputs, A, B, and C, and three outputs, X, Y, and Z. Input A is provided to the control input of each of MUXes 12 and 14, and is also provided directly as output X. A first input of MUX 12 is coupled to receive input C, a second input of MUX 14 is coupled to receive input B, and an output of MUX 12 provides output Y. A first input of MUX 14 is coupled to receive input B, a second input of MUX 14 is coupled to receive input C, and an output of MUX 14 provides output Z. When the control input of MUX 12 or 14 is a logic level zero, the first input of the MUX is provided as the output of the MUX, and when the control input of MUX 12 or 14 is a logic level one, the second input of the MUX is provided as the output of the MUX.

The resulting truth table for Fredkin gate 10 is provided in FIG. 1B, in which all the logic states are provided in binary form. Note that in each row, the inputs A, B, and C include a same number of logic ones as the corresponding outputs X, Y, and Z. For example, when ABC=010, then XYZ=001. That is, with A=0, each of MUX 12 and 14 selects the first input to provide as its outputs, therefore, MUX 12 provides C as Y (such that Y=0) and MUX 14 provides B as Z (such that Z=1). Also, each combination of outputs X, Y and Z corresponds to a unique combination of inputs A, B, C. For example, the output XYZ=001 is only obtained with inputs ABC=010, and no other combination of ABC provides output XYZ=001. This is true for all rows of the truth table. Note that Fredkin gate 10, with MUXes 12 and 14, can be implemented with standard CMOS core library cells.

Still referring to Fredkin gate 10, note that the logic function of an AND gate, OR gate, or inverter can be achieved with Fredkin gate 10. For example, by fixing B to the constant logic zero (in which B would be considered an "ancilla input"), the remaining variables implement an AND function. That is, with B fixed to zero, gate 10 provides an AND logic function in which Z=A AND C. In this case, X and Y are considered "garbage outputs" because they are not used for this function. Similarly, by fixing C to the constant logic one (in which C would now be considered an "ancilla input"), the remaining variables implement an OR logic function in which Z=A OR B. In this case, X and Y again are considered "garbage outputs". Similarly, by fixing B to a logic zero and C to a logic one (in which both B and C are "ancilla inputs"), gate 10 provide an inverse logic function in which Y=NOT A. In this case, X and Z are considered "garbage outputs" since they are not used for this function. Since Fredkin gate 10 can be used to implement logic functions such as OR, AND, and an inverter (by fixing ancilla inputs to constants and ignoring garbage outputs), any combinatorial logic can be implemented using Fredkin gates. However, more area is generally required since both ancilla inputs and garbage outputs are wasted area.

However, when conservative reversible gates (e.g. Fredkin gates) are used to implement combinatorial logic, the resulting logic is conservative reversible logic (also referred to as a conservative reversible circuit). Note that in the case of any conservative reversible circuit, when an all-zero vector is applied at the inputs, all outputs of the circuit are also logic zero, and when an all-one vector is applied at the inputs, all outputs are also logic one. For example, as can be seen in FIG. 1B, when all logic zeros are applied as ABC, outputs XYZ are also all logic zeros, and when all logic ones are applied as ABC, outputs XYZ are also all logic ones. If Fredkin gates are used to implement a conservative reversible circuit, then when all inputs to the circuit are logic zero, all outputs should also be logic zero, and when all inputs are logic one, all outputs should also be logic one. Therefore, for conservative reversible logic, by using only two test vectors applied to the inputs (an all-zero vector and an all-one vector), 100% stuck-at fault coverage can be achieved for all nodes of the conservative reversible logic. Similarly, transitions can be tested using the same two vectors in which first, an all-zero vector is applied, followed by an all-one vector, and the outputs are captured after a time interval equivalent to the application clock. The outputs should be all logic one. Afterwards, the all-one vector can be applied, followed by the all-zero vector, in which the outputs are captured after the same time interval equivalent to the application clock. In this case, the outputs should be all logic zero. In this manner, 100% transition coverage can also be achieved for the conservative reversible logic.

Figure 2:
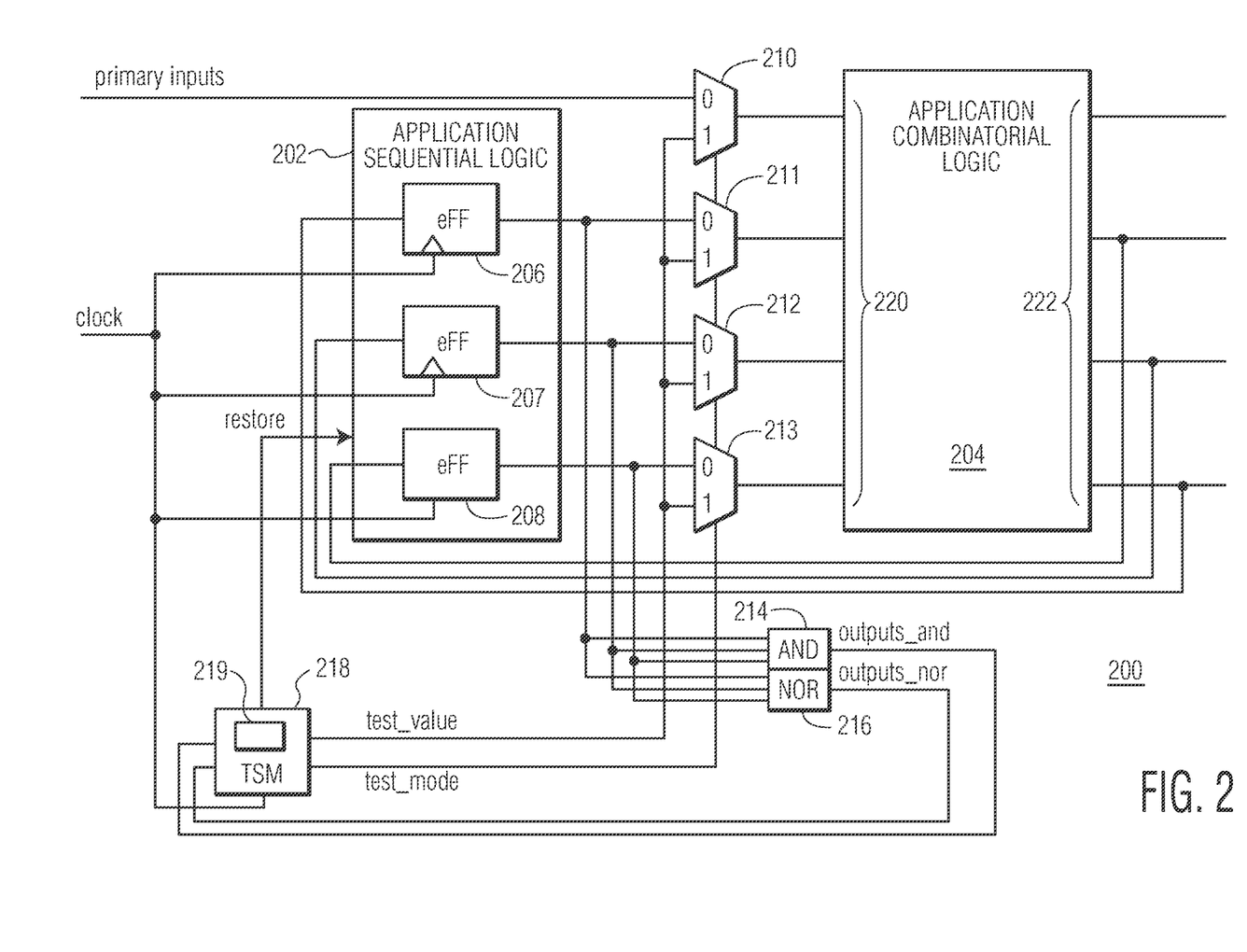
FIG. 2 illustrates, in block diagram form, an integrated circuit (IC) having testing circuitry, in accordance with one embodiment of the present invention.

FIG. 2 illustrates, in bock diagram form, an IC 200 including application combinatorial logic 204 (also referred to as combinatorial logic circuitry or combinatorial circuitry), application sequential logic circuitry 202, and self-test circuitry including a test control circuit 218 (also referred to as a testing state machine (TSM), an AND gate 214, and an OR gate 216. Application combinatorial logic 204 includes digital logic (i.e. circuitry) used to implement any desired function for IC 200. For example, it may implement timers, counters, adders, etc. In one embodiment, combinatorial logic 204 is part of a processor core of IC 200, in which the processor core of IC 200 executes application code. Application combinatorial logic 204 is implemented as conservative reversible logic. For example, combinatorial logic 204 can be implemented with Fredkin gates, such as Fredkin gate 10. Alternatively, other types of conservative reversible gates may be uses instead or in addition to the Fredkin gates, such as Toffoli gates or CNOT gates (which are also conservative reversible gates). Application combinatorial logic 204 has inputs 220 and provides outputs 222.

Application sequential logic 202 includes one or more extended flip flop circuits (eFF) 206-208 (also referred to as flip flop circuits or enhanced flip flop circuits). Each eFF includes a flip-flop configured to provide inputs to and receive outputs from application combinatorial logic 204 during application mode (i.e. normal operation), and a state saving flip-flop to allow for self-testing to occur. One or more MUXes 210-213 are coupled between the eFFs and application combinatorial logic 204 such that the MUXes can either provide data values to inputs 220 from eFFs 206-208 or test values to inputs 220 from test controller 218. Therefore, a control input for each of MUXes 210-213 is coupled to a test_mode signal from test controller 218, a first input of each MUX is coupled to receive data inputs (from the eFFs or from elsewhere in IC 200) and a second input of each MUX is coupled to receive test value inputs from test controller 218. Outputs 222 are provided back to sequential logic 202, in which each output is provided to a corresponding eFF of eFFs 206-208. Outputs of eFFs 206-208 are provided to AND circuit 214 which performs an AND function and provides the result as Outputs_and to test controller 218. Outputs of eFFs 206-208 are also provided to NOR circuit 216 which performs a NOR function and provides the result as Outputs_nor to test controller 218. Test controller 218 includes storage circuitry 219 and provides a restore signal to each of eFFs 206-208 in application sequential logic 202, provides a test vector as test_value to the second inputs of MUXes 210-213, and provides test_mode to the control input of each of MUXes 210-213 and to each eFF. A clock signal is provided to a clock input of each of eFFs 206-208 and to test controller 218.

Figure 3:
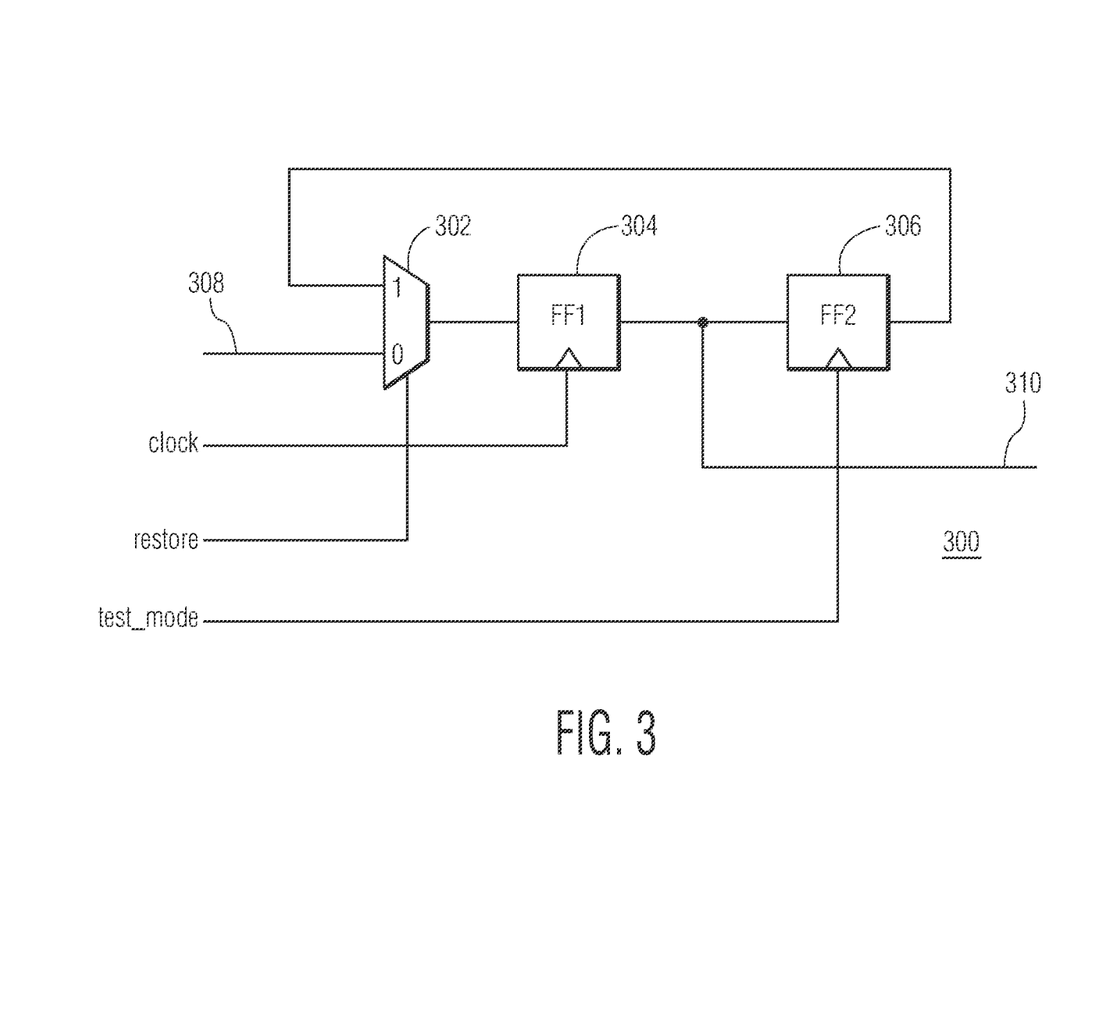
FIG. 3 illustrates, in block diagram form, an extended flip-flop of FIG. 2, in accordance with one embodiment of the present invention.

FIG. 3 illustrates an eFF 300 which can be used as any of eFFs 206-208 of FIG. 2. The circuit eFF 300 includes D flip flops 304 and 306 (i.e. FF1 and FF2, respectively) and a MUX 302. The circuit eFF 300 also receives a data input 308, the clock input, the restore signal, the test_mode input, and provides a data output 310. Data input 308 may correspond to any of the inputs to eFFs 206-208 illustrated in FIG. 2, and data output 310 may correspond to any of the outputs of eFFs 206-208 provided to a corresponding MUX of MUXes 208-213. A control input of MUX 302 is coupled to receive the restore signal, a first input of MUX 302 is coupled to a data output of FF2, and a second input of MUX 302 is coupled to receive data input 302. A clock input of FF1 is coupled to receive the clock. A data output of FF1 is coupled to a data input of FF2, and a clock input of FF2 is coupled to receive the test_mode signal. The data output of FF1 is coupled to provide data output 310. Note that the logic (i.e. digital) signals herein can each have a logic zero state and a logic one state, in which the logic zero state may be referred to as a logic level zero, or simply a logic zero, and the logic one state may be referred to as a logic level one, or simply a logic one.

FF1 provides the functionality needed for normal operation (i.e. when test_mode is negated to a logic level zero, also referred to as non-test mode), while FF2 stores the contents of FF1 during testing (i.e. FF2 saves the state of FF1 while test_mode is asserted to a logic level one). That is, when test_mode is asserted to one at the clock input of FF2, the contents of FF1 are clocked into (stored into) FF2 in preparation for self-test mode (also referred to as test mode). During self-test mode, the contents of FF1 can be overwritten as needed during test since the state of FF1 was first saved to FF2 upon entering test mode. When the self-test mode ends, prior to returning to normal operation, the restore signal is asserted such that the contents of FF2 are restored to FF1. That is, the data output of FF2 is provided to the first input of MUX 302 such that when the restore signal is a logic level one, the data output of FF2 rather than data input 308 is provided for storage into FF1 upon an active edge of the clock. During normal operation, while restore is negated to a logic level 0, data input 308 is stored in FF1 in accordance with the clock signal, and the data output of FF1 is provided as data output 310. In the illustrated embodiment, the rising edge of the clock is the active edge such that for each clock input to the D flip flops, the value at the data input gets stored into the flip flop in response to a rising edge of the clock. Alternatively, the falling edge can be used as the active edge.

In operation, application combinatorial logic 222 performs application functions during normal operation (also referred to as application mode) of IC 200, and test controller 218 performs self tests on application combinatorial logic 222 by entering a self-test mode and asserting test_mode to a logic level one. Self-test mode for performing the self-testing can be entered at small breaks during normal operation. These breaks are usually short enough so as not to significantly slow down the application. During the self-test mode, the self test is directed by test controller 218, which may be implemented as a state machine. Also, with the eFFs storing the state during self-test mode, the execution of application code is not disturbed since the state is restored prior to returning to normal operation. During normal operation, test_mode is negated to a logic level zero and application combinatorial logic 222 performs the normal functions of IC 200. Also, during normal operation, sequential logic 202 operates such that each eFF utilizes its corresponding FF1 to receive data inputs and provide data outputs, in which the data outputs are provided via the first inputs of MUXes 210-213 to application combinatorial logic 204 (due to test_mode at the control inputs of MUXes 210-213 being zero). Operation of FIGS. 2 and 3 will be described in more detail in combination with the timing diagrams of FIGS. 4 and 5.

Figure 4:
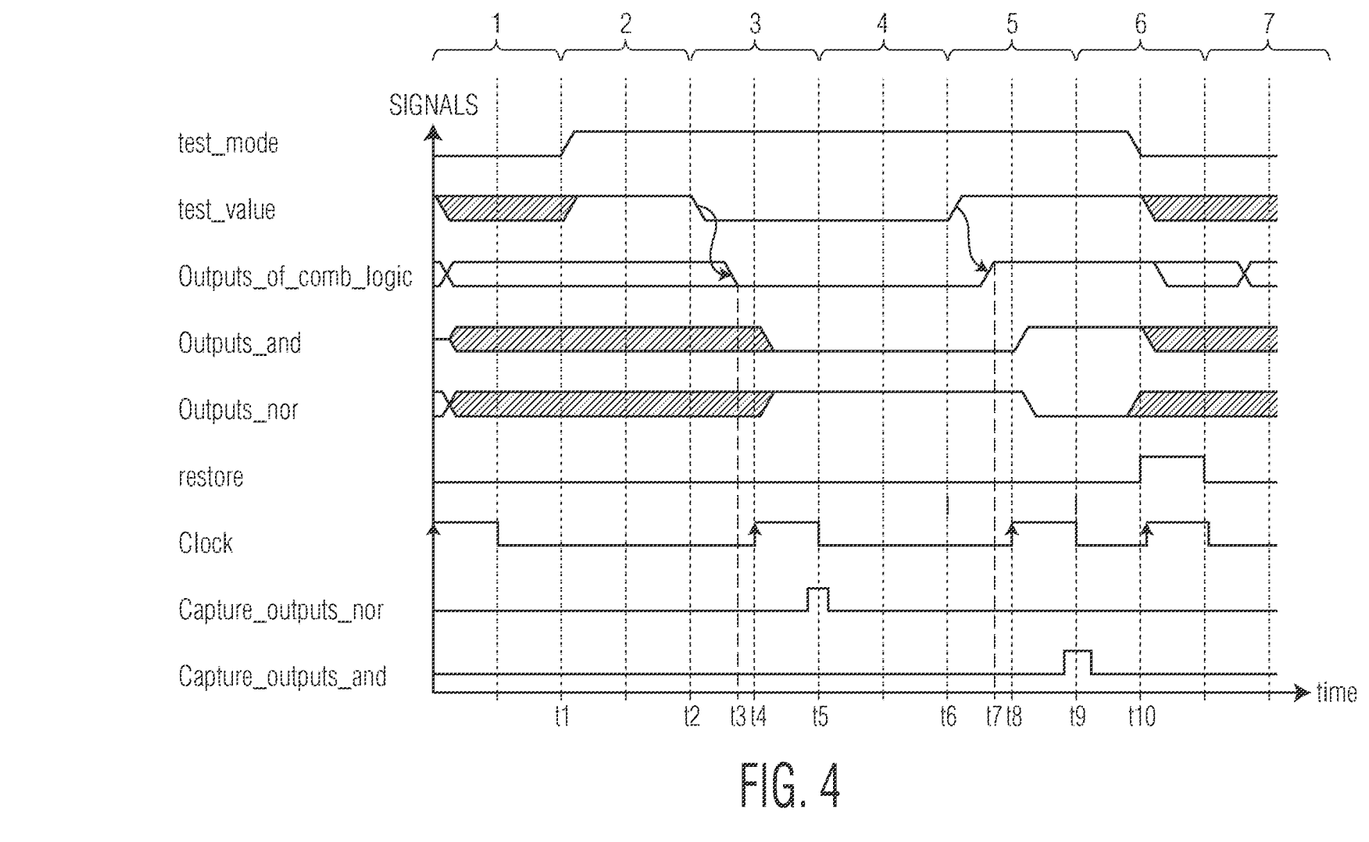
FIGS. 4 and 5 illustrate timing diagrams for various signals in the IC of FIG. 2, in accordance with embodiments of the present invention.

FIG. 4 illustrates a timing diagram of various signals of IC 200 during a self-test mode (also referred to as a test mode) in which no faults occur. In the timing diagrams of FIGS. 4 and 5, timing periods 1-7 are labeled above the diagram. These may correspond to clock cycles of the application cycle during normal operation (e.g. in non-test mode). However, note that during self-test mode, the timing of the clock is modified, but for ease of explanation, the time periods 1-7 are continuously labeled throughout each of FIGS. 4 and 5. Referring first to FIG. 4, time period 1 corresponds to the last application clock cycle of the application mode (when the clock is being operated in accordance with normal operation), thus test_mode is negated at a logic level zero. At the start of time period 2, at time t1, the test_mode signal is asserted to a logic level one. The assertion of test_mode to a logic level one causes the data in the FF1 of all the eFFs (e.g. eFFs 206-208) to be clocked into FF2 and thus stored in FF2. This saves the state of the application mode prior to entering self-test mode and performing any tests during the self-test mode. Also, at time t1, test controller 218 sets the test_value to one, such that that an input vector of logic ones is provided to combinatorial logic 204.

At time t2, test controller 218 provides the test value of logic zero, which is provided to application combinatorial logic 204 via the second inputs of MUXes 206-208 (due to the control input of each MUX being logic zero). This will be used to test for transition faults for a one to zero transition and for a stuck-at-one fault. When test mode is entered in time period 2, note that the clock signal is controlled by test controller 218 such that that no clock signal is yet applied. When the all-zero test vector is applied at time t2 to inputs 220 of combinatorial logic 204, the expectation is that the input values propagate through combinatorial logic 204 to result in an all-zero output on outputs 222 within a maximum expected amount of time.

In time period 3, at time t3, the test values at inputs 220 have propagated through combinatorial logic 204 to the outputs 222, in which the values at outputs 222 are labeled "Outputs_of_comb_logic" in FIG. 4. In FIG. 4, all of outputs 222 at time t3 are logic zero. At time t4, a pulse of the clock is applied to the FF1 of sequential logic 202, thus capturing the value of outputs 222 into the FF1s. The timing of the clock during test_mode is provided by test controller 218 and is adapted to the maximum expected propagation time of logic 204. If the signals propagate to the FF1 within this maximum propagation time, the Outputs_of_comb_logic are properly stored in the FF1 in response to the clock pulse. The stored output values in the FF1 are also provided to NOR gate 214, in which NOR gate 214 has an input corresponding to each eFF of sequential logic 202, and to AND gate 216 in which AND gate 216 also has an input corresponding to each eFF of sequential logic 202. (Note that IC 200 may include any number of eFFs (e.g. 206-208) and any number of MUXes (e.g. 210-213), determined by the number of inputs and outputs of combinatorial logic 204, in which that number can be any integer number greater than zero.)

After time t4 (still within time period 3), the output values from the FF1 of sequential logic 202 have propagated through NOR gate 216 and AND gate 214, in time to be captured by test controller 218 at time t5. Since all outputs are expected to be logic zero, the output of NOR gate 216 (labeled as Outputs_nor on FIG. 4) is expected to be logic one (since, in boolean logic, 0 NOR 0=1). The output of AND gate 214 (labeled as Outputs_and on FIG. 4) is expected to be logic zero (since, in boolean logic, 0 AND 0=0). At time t5, the output of NOR gate 216 is captured by test controller 218 and stored as Capture_outputs_nor in storage circuitry 219. In this example, the captured value is logic one, as expected. This indicates to test controller 218 that there were no stuck-at-one faults within combinatorial logic 204, because if there had been, the output of NOR gate 214 would have remained logic zero (as is the case in FIG. 5). This also indicates that there were no transition faults within combinatorial logic 204 for a one to zero transition because the correct values propagated through combinatorial logic 204 within an expected amount of time.

Figure 5:
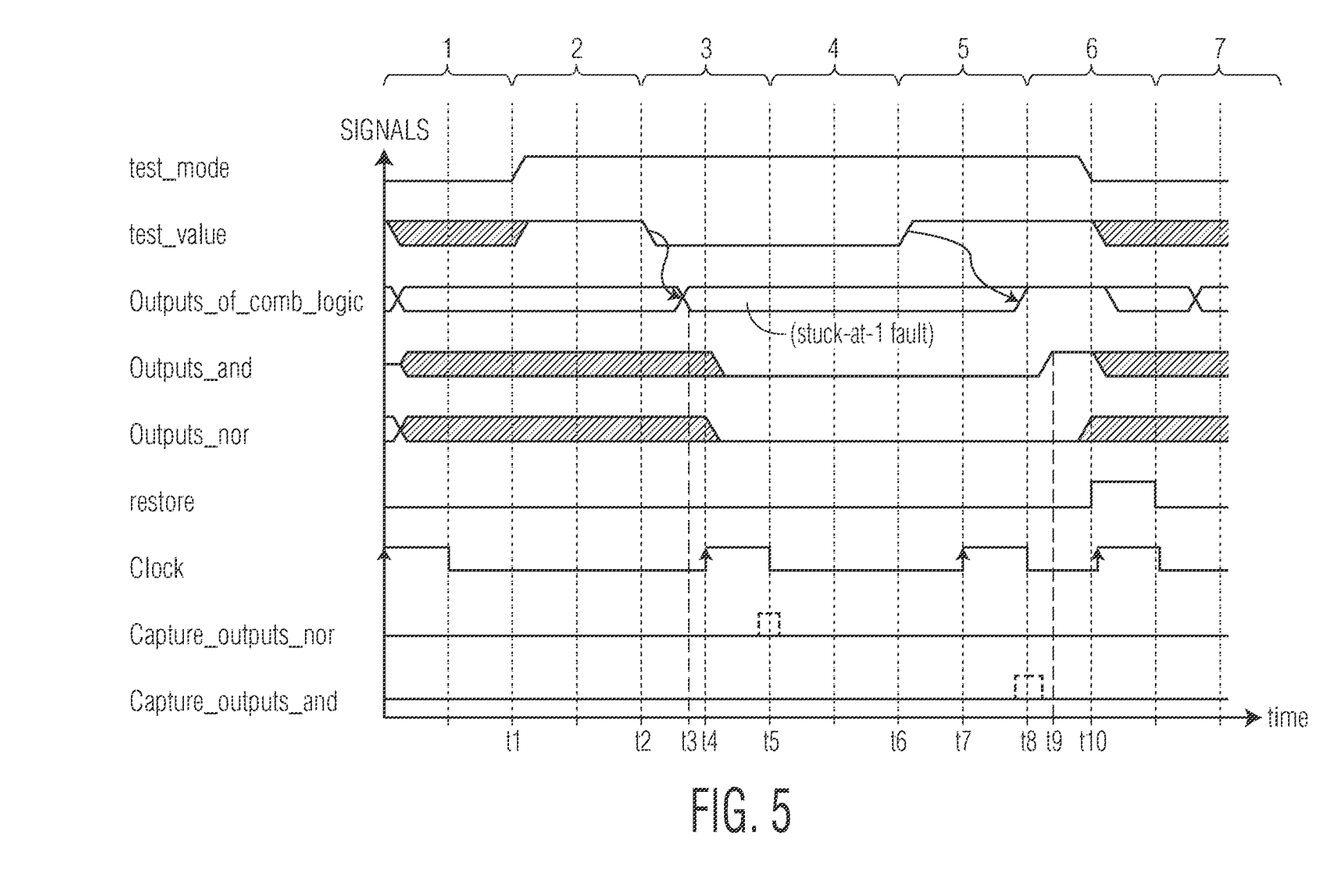

Referring to FIG. 5, time periods 1 and 2 are the same, but it is assumed that logic 204 includes a stuck-at-one fault. Therefore, at time t3 in FIG. 5, the values of Outputs_of_comb_logic are not all logic zeros due to at least one node being stuck at a logic level one. Since this is the case, at time t4, when the pulse of the clock is applied to the FF1 of sequential logic 202, the values of outputs 222 which are captured into the FF1 include at least one value of logic one. After time t4, the output values from the FF1 of sequential logic 202 propagate through NOR gate 216 and AND gate 214, in time to be captured by test controller 218 at time t5. However, due to the at least one value of logic one provided to NOR gate 216, Outputs_nor goes to a logic level zero and therefore, at time t5, Capture_outputs_nor remains at logic zero (rather than capturing the expected value of logic one). This indicates to test controller 218 that there was a fault.

Referring back to FIG. 4, the transition of zero to one is tested starting in time period 5, when, at time t6, test controller 218 sets the test_value to a logic level one, such that an input test vector of all logic ones is provided to inputs 220 of combinatorial logic 204 via the second input of MUXes 206-208. At time t7, the values at inputs 220 have propagated through to outputs 222. Since an all-one vector was applied to inputs 220 of conservative reversible logic, the values at outputs 222 are all logic ones as well, as expected. At time t8, a pulse of the clock is applied to the FF1 of sequential logic 202, thus capturing the values of outputs 222 into the FF1s. Test controller 218 again controls the timing of the next clock to occur after a maximum expected propagation time through logic 204.

After time t8 (still within time period 5), the output values from the FF1 of sequential logic 202 have propagated through NOR gate 216 and AND gate 214, in time to be captured by test controller 218 at time t5. Outputs_and at the output of AND gate 216 is a logic one, and Outputs_nor is a logic zero, and at time t9, the output of AND gate 214 is captured by test controller 218 and stored as Capture_outputs_and in storage circuitry 219.

Capture_outputs_and is a logic one, as expected, which indicates to test controller 218 that there were no stuck-at-zero faults within combinatorial logic 214. This also indicates that there are no transition faults because the correct values propagated through combinatorial logic 204 within an expected amount of time. Note that in the illustrated embodiment, the Outputs_nor and Outputs_and are captured on a falling edge of the clock signal, but depending on the design of storage circuitry 219, can be captured on a rising edge instead, and the timing of the clock signal would be adjusted accordingly.

However, in FIG. 5, not only does a stuck-at-one fault occur, but a transition fault occurs as well, at a different node of logic 204, on the transition from zero to one. Therefore, at time t6, as in FIG. 4, the test_value of ones is applied to inputs 220. However, the next clock pulse at time t7 is designed to give time for the values at inputs 220 to propagate to outputs 222. However, at time t7, due to one or more transition faults resulting in an overly long propagation delay, the FF1 do not capture the proper values of Outputs_of_comb_logic because not all of the outputs 222 complete the transition to all ones until time t8. Therefore, since the FF1 did not capture just logic ones, the output of AND gate 214 does not transition to a logic one in time to be captured at time t8 by test controller 218. In this case, even if Outputs_and eventually transitions to a logic one, it does not do so until time t9, which is too late to be captured by test controller 218. In this example, the value captured into storage circuitry 219 at time t8 as Capture_outputs_and is a logic zero, and not the expected logic one value, indicating that a fault occurred. In this example, no stuck-at-zero fault occurred, since Outputs_of_comb_logic still provided the expected logic ones at outputs 222. However, even though the correct values propagated through, there was a slow down at one or more nodes of combinatorial logic 204 causing the results to arrive at outputs 222 too late and outside the permissible propagation time.

In the example of FIG. 5, due to the stuck-at-one fault, Capture_outputs_nor was captured as a logic zero and not a logic one at time t5, and due to the transition fault, Capture_outputs_and was captured as a logic zero and not a logic one at time t8. Both Capture_outputs_nor and Capture_outputs_and were expected to be logic ones (as indicated by the dotted line pulses at time t5 and time t8), but were not and thus indicates two faults. Note that test controller 218 can therefore indicate a fault each time Capture_outputs_nor or Capture_outputs_and is captured as a logic zero instead of the expected logic one. However, the stored values for Capture_outputs_nor or Capture_outputs_and, alone, may not be sufficient information to indicate whether the fault was due to a stuck-at fault or a transition fault. In the rare case where this additional information is required, the test can be re-run with a significantly lower clock frequency. In the case in which the test passes, a transition fault is indicated, and in the case in which the test still fails, a stuck-at fault is indicated.

In both FIGS. 4 and 5, at time t10, the test mode is exited and test_mode is negated back to a logic zero, which again allows all of MUXes 210-213 to provide the first inputs as inputs 220 to combinatorial logic 204. At time t10, test controller 218 also asserts restore, which results in the data output of FF2 being provided back to FF1. For example, referring to FIG. 3, the output of FF1 306 is provided via the first input of MUX 302 (now selected due to the assertion of restore to a logic level one) to FF1 304. This is done in each of the eFFs to restore the state back to the application mode values. Therefore, after time t10, IC 200 is back in application mode and can continue with normal operation.

IC 200 may include any amount of conservative reversible logic such as combinatorial logic 204, in which the test circuitry of IC 200 would include eFFs and MUXes for each of the inputs and outputs of the conservative combinatorial logic. Test controller 218 can run the self-test on all the conservative reversible logic at once, or only on subsections at a time. Each block of conservative reversible logic may have different propagation times, and therefore, test controller 218 may use different timings for the transition testing.

In one embodiment, test controller 218 is implemented as a state machine which provides the test values to application combinatorial logic 204 (e.g. via MUXes 210-213) and receives the results (e.g. the outputs of AND gate 214 and NOR gate 216) to determine whether or not the results match expected values. Alternatively, test controller 218 can be implemented with one or more state machines, or as a microprocessor, as needed for all the conservative reversible logic of IC 200. Test controller 218 can perform the self testing with minimal interruption to the application mode (normal operating mode) by, for example, timing the self-test to occur during particular clock cycles or during small breaks taken during application mode.

Although in the examples of FIGS. 4 and 5, the one to zero transition was tested prior to the zero to one transition, the order can be reversed. Also, since conservative reversible logic is being tested, it is known that the expected output for an all-one input test vector is all logic ones and the expected output for an all-zero input test vector is all logic zeros. AND gate 214 and NOR gate 216 are used in the examples of FIGS. 4 and 5 to determine if the outputs provide the expected value. However, alternate embodiments can use different combinations of one or more logic gates to provide the indication as to whether or not the outputs of the conservative reversible logic are as expected. Furthermore, other logic can be used within test controller 218 to determine if the expected value was provided in an expected (e.g. a predetermined) amount of time or not to know if a transition fault occurred.

Therefore, it can be understood how through the use of conservative reversible logic to implement any combinatorial logic on an IC, 100% stuck-at and transition fault coverage can be achieved. In this manner, complete coverage can be obtained for BTI-related hold and setup timing violations. Furthermore, due to the conservative reversible logic, this coverage can be achieved through the application of only two different test vectors, an all-one test vector and an all-zero test vector. Many times, these faults occur due to BTI stresses over time, and with the use of extended flip flops (eFFs), this testing can be performed at any time with minimal disruption of the normal operation of the IC, while the device is being used in the field.

Although greater overhead is required in terms of area and power to implement conservative reversible logic, there are applications in which it is critical to ensure 100% detection of any stuck-at and transition faults caused, for example, by BTI stresses over time. For example, reliability-critical ICs, such as ICs with security-relevant logic (e.g. logic that restricts access, grants privileges, handles authentication, etc.), with safety-relevant logic (e.g. logic for which a failure may endanger human lives), or with test logic (e.g. test logic itself which ensures fault coverage) can be implemented with conservative reversible logic in which it is acceptable and worthwhile to take the hit in power or area in order to ensure fail-safe IC operation. The use of the conservative reversible logic often provides improved coverage over DMR or TMR, neither of which can offer fail-safe IC operation, as discussed above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 2 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, a different ordering may be used to apply the all-one and all-zero test vectors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit device includes enhanced flip flop circuits, each enhanced flip flop circuit including: a multiplexer having a first input, a second input, an output and a control input coupled to a restore signal; a first flip flop circuit activated by a clock pulse and including an input coupled to the output of the multiplexer, and an output; a second flip flop circuit activated by a test_mode signal and including an input coupled to the output of the first flip flop circuit and an output coupled to the first input of the multiplexer; and an output from each of the enhanced flip flop circuits is coupled to the output of the first flip flop circuit. The integrated circuit device further includes combinatorial logic circuitry including inputs and outputs, each of the inputs of the combinatorial logic coupled to a corresponding output from one of the enhanced flip flop circuits during a non-test mode and to a test value signal during a test mode, and each of the outputs of the combinatorial logic coupled to the second input of the corresponding one of the enhanced flip flop circuits, wherein the combinatorial logic is reversible by having the same number of outputs as inputs and a bijective transfer function from the inputs to the outputs of the combinatorial logic circuitry, and conservative by having the same number of signals in a logic one state at the outputs and the inputs. In one aspect, the integrated circuit device further includes a first logic gate having inputs and an output, with each of the inputs coupled to a corresponding one of the outputs of the enhanced flip flop circuits, and the output indicates whether all of the outputs of the enhanced flip flop circuits have the same value of zero. In a further aspect, the integrated circuit device further includes a second logic gate having inputs and an output, with each input coupled to a corresponding one of the outputs of the enhanced flip flop circuits, and the output indicates whether all of the outputs of the enhanced flip flop circuits have the same value of one. In yet a further aspect, the integrated circuit device further includes a test state machine configured to provide the test_mode and test_value signals and to determine whether the output of the first logic gate and the output of the second logic gate have expected values. In another aspect, of the above embodiment, the combinatorial logic circuitry is implemented using Fredkin gates. In another aspect, during a test, contents stored in the first flip flop circuits are transferred to the second flip flop circuits before applying test values to the first flip flop circuits when the test_mode signal is asserted, and contents in the second flip flop circuits are restored to the first flip flop circuits after the test values have been applied and the restore signal and the clock pulse are asserted and the test_mode signal is deasserted. In a further aspect, during a stuck-at test, a test value of zero is applied to the inputs of the first flip flop circuits and a test state machine determines whether the test value of zero appears at the outputs of the first flip flop circuit, and next, a test value of one is applied to the inputs of the first flip flop circuits and the test state machine determines whether the test value of one appears at the outputs of the first flip flop circuits. In another further aspect, during a transitions test, a test value of zero is applied to the first flip flop circuits followed by a test value of one, and a test state machine determines whether the test value of one appears at the outputs of the first flip flop circuits; and next, a test value of one is applied to the inputs of the first flip flop circuits, followed by a zero value, and the test state machine determines whether the test value of zero appears at the outputs of the first flip flop circuits. In another aspect of the above embodiment, the integrated circuit device further includes a processing core configured to execute application code; wherein, while the application code is executed, the enhanced flip flop circuitry and combinatorial logic circuitry operate during a clock cycle of the application code without disturbing execution of the application code.

In another embodiment, a method for testing aging effects in an integrated circuit, includes, during a test mode: transferring contents of a first set of flip flop circuits to a second set of flip flop circuits, retaining the contents of the first set of flip flop circuits in the second set of flip flop circuits until the test mode is finished; applying a first test value to inputs of a combinatorial logic circuit and providing outputs from the combinatorial logic circuitry to inputs of the first set of flip flop circuits, wherein the combinatorial logic circuitry is reversible and conservative; determining whether the outputs from the first flip flop circuits match the first test value; applying a second test value to the inputs of the combinatorial logic circuitry and providing the outputs from the combinatorial logic circuitry to the inputs of the first set of flip flop circuits; determining whether the outputs from the first flip flop circuits match the second test value; and once the test mode is finished, transferring contents of the second set of flip flop circuits to the first set of flip flop circuits. In one aspect, the method further includes using a NOR logic gate having inputs coupled to the outputs of the first flip flop circuits, and an output that indicates whether all of the outputs of the first flip flop circuits have a same value of zero. In another aspect, the method further includes using an AND logic gate having inputs coupled to the outputs of the first flip flop circuits, and an output indicating whether all of the outputs of the first flip flop circuits have a same value of one. In a further aspect, the method further includes using a test state machine to provide test mode and first and second test value signals and to determine whether the output of the first logic gate and the output of the second logic gate have expected values. In another aspect of the another embodiment, the combinatorial logic circuitry is implemented using Fredkin gates. In another aspect, the method further includes, during a stuck-at test: applying a test value of zero to the inputs of the first flip flop circuits; determining whether the test value of zero appears at the outputs of the first flip flop circuits; applying a test value of one to the inputs of the first flip flop circuits; and determining whether the test value of one appears at the outputs of the first flip flop circuits. In yet another aspect, the method further includes, during a transition test: applying a test value of zero to inputs of the first flip flop circuits followed by a test value of one; determining whether the test value of one appears at the outputs of the first flip flop circuits; applying a test value of one to the inputs of the first flip flop circuits, followed by a zero value; and determining whether the test value of zero appears at the outputs of the first flip flop circuits. In another aspect of the another embodiment, the method further includes executing application code in a processor core; while the application code is executed, operating the first and second flip flop circuits and combinatorial logic circuitry while the application code is executed.

In yet another embodiment, a processing system includes a processor core configured to execute application code; a test circuit to perform tests that indicate aging effects on the processor core, the test circuit including: a first set of flip flop circuits; a second set of flip flop circuits, wherein outputs of the first set of flip flop circuits are connected to corresponding inputs of the second flip flop circuits; combinatorial logic circuitry having inputs coupled to outputs of the first set of flip flop circuits when not in test mode, and to receive test values during the test mode, wherein the combinatorial logic circuitry is reversible and conservative; a set of multiplexers with first inputs coupled to corresponding outputs of the second flip flop circuits, second inputs coupled to corresponding outputs of the combinatorial logic circuitry, and outputs coupled to corresponding inputs of the first set of flip flop circuits; wherein when the test mode begins, contents of the first flip flop circuits are transferred to corresponding ones of the second flip flop circuits, output values from the combinatorial logic circuitry are provided to inputs of the first flip flop circuits, and the outputs of the first flip flop circuits are compared to the test values. In aspect, during a stuck-at test: a test state machine is configured to apply a test value of zero to the inputs of the first flip flop circuits and determine whether the test value of zero appears at the outputs of the first flip flop circuits; and the test state machine is further configured to apply a test value of one to the inputs of the first flip flop circuits and determine whether the test value of one appears at the outputs of the first flip flop circuits. In another aspect, during a transition test: a test state machine is configured to apply a test value of zero to the first flip flop circuits followed by a test value of one, and determine whether the test value of one appears at the outputs of the first flip flop circuits; and the test state machine is further configured to apply a test value of one to the inputs of the first flip flop circuits, followed by a zero value, and determine whether the test value of zero appears at the outputs of the first flip flop circuits.

What is claimed is:

1. An integrated circuit device comprising:
    enhanced flip flop circuits, each enhanced flip flop circuit including:
        a multiplexer having a first input, a second input, an output and a control input coupled to a restore signal;
        a first flip flop circuit activated by a clock pulse and including an input coupled to the output of the multiplexer, and an output;
        a second flip flop circuit activated by a test_mode signal and including an input coupled to the output of the first flip flop circuit and an output coupled to the first input of the multiplexer;
        an output from each of the enhanced flip flop circuits is coupled to the output of the first flip flop circuit;
    combinatorial logic circuitry including inputs and outputs, each of the inputs of the combinatorial logic coupled to a corresponding output from one of the enhanced flip flop circuits during a non-test mode and to a test value signal during a test mode, and each of the outputs of the combinatorial logic coupled to the second input of the corresponding one of the enhanced flip flop circuits, wherein the combinatorial logic is reversible by having the same number of outputs as inputs and a bijective transfer function from the inputs to the outputs of the combinatorial logic circuitry, and conservative by having the same number of signals in a logic one state at the outputs and the inputs.

2. The integrated circuit device of claim 1 further comprising:
    a first logic gate having inputs and an output, with each of the inputs coupled to a corresponding one of the outputs of the enhanced flip flop circuits, and the output indicates whether all of the outputs of the enhanced flip flop circuits have the same value of zero.

3. The integrated circuit device of claim 2 further comprising:
    a second logic gate having inputs and an output, with each input coupled to a corresponding one of the outputs of the enhanced flip flop circuits, and the output indicates whether all of the outputs of the enhanced flip flop circuits have the same value of one.

4. The integrated circuit device of claim 3 further comprising:
    a test state machine configured to provide the test_mode and test_value signals and to determine whether the output of the first logic gate and the output of the second logic gate have expected values.

5. The integrated circuit device of claim 1 wherein:
    the combinatorial logic circuitry is implemented using Fredkin gates.

6. The integrated circuit device of claim 1 wherein during a test:
    contents stored in the first flip flop circuits are transferred to the second flip flop circuits before applying test values to the first flip flop circuits when the test_mode signal is asserted, and contents in the second flip flop circuits are restored to the first flip flop circuits after the test values have been applied and the restore signal and the clock pulse are asserted and the test_mode signal is deasserted.

7. The integrated circuit device of claim 6 wherein:
    during a stuck-at test:
        a test value of zero is applied to the inputs of the first flip flop circuits and a test state machine determines whether the test value of zero appears at the outputs of the first flip flop circuits;
        next, a test value of one is applied to the inputs of the first flip flop circuits and the test state machine determines whether the test value of one appears at the outputs of the first flip flop circuits.

8. The integrated circuit device of claim 6 wherein:
    during a transitions test:
        a test value of zero is applied to the first flip flop circuits followed by a test value of one, and a test state machine determines whether the test value of one appears at the outputs of the first flip flop circuits;
        next, a test value of one is applied to the inputs of the first flip flop circuits, followed by a zero value, and the test state machine determines whether the test value of zero appears at the outputs of the first flip flop circuits.

9. The integrated circuit device of claim 1 further comprising:
    a processing core configured to execute application code;
    while the application code is executed, the enhanced flip flop circuitry and combinatorial logic circuitry operate during a clock cycle of the application code without disturbing execution of the application code.

10. A method for testing aging effects in an integrated circuit, comprising:

during a test mode:
- transferring contents of a first set of flip flop circuits to a second set of flip flop circuits,
- retaining the contents of the first set of flip flop circuits in the second set of flip flop circuits until the test mode is finished;
- applying a first test value to inputs of a combinatorial logic circuit and providing outputs from the combinatorial logic circuitry to inputs of the first set of flip flop circuits, wherein the combinatorial logic circuitry is reversible and conservative;
- determining whether the outputs from the first flip flop circuits match the first test value;
- applying a second test value to the inputs of the combinatorial logic circuitry and providing the outputs from the combinatorial logic circuitry to the inputs of the first set of flip flop circuits;
- determining whether the outputs from the first flip flop circuits match the second test value; and once the test mode is finished, transferring contents of the second set of flip flop circuits to the first set of flip flop circuits.

11. The method of claim 10 further comprising:
using a NOR logic gate having inputs coupled to the outputs of the first flip flop circuits, and an output that indicates whether all of the outputs of the first flip flop circuits have a same value of zero.

12. The method of claim 10 further comprising:
using an AND logic gate having inputs coupled to the outputs of the first flip flop circuits, and an output indicating whether all of the outputs of the first flip flop circuits have a same value of one.

13. The method of claim 12 further comprising:
using a test state machine to provide test mode and first and second test value signals and to determine whether the output of the first logic gate and the output of the second logic gate have expected values.

14. The method of claim 10 wherein:
the combinatorial logic circuitry is implemented using Fredkin gates.

15. The method of claim 10 further comprising:
during a stuck-at test:
- applying a test value of zero to the inputs of the first flip flop circuits;
- determining whether the test value of zero appears at the outputs of the first flip flop circuits;
- applying a test value of one to the inputs of the first flip flop circuits; and
- determining whether the test value of one appears at the outputs of the first flip flop circuits.

16. The method of claim 10 further comprising:
during a transition test:
- applying a test value of zero to inputs of the first flip flop circuits followed by a test value of one;
- determining whether the test value of one appears at the outputs of the first flip flop circuits;
- applying a test value of one to the inputs of the first flip flop circuits, followed by a zero value; and
- determining whether the test value of zero appears at the outputs of the first flip flop circuits.

17. The method of claim 10 further comprising:
executing application code in a processor core;
while the application code is executed, operating the first and second flip flop circuits and combinatorial logic circuitry while the application code is executed.

18. A processing system comprising:
a processor core configured to execute application code;
a test circuit to perform tests that indicate aging effects on the processor core, the test circuit including:
- a first set of flip flop circuits;
- a second set of flip flop circuits, wherein outputs of the first set of flip flop circuits are connected to corresponding inputs of the second flip flop circuits;
- combinatorial logic circuitry having inputs coupled to outputs of the first set of flip flop circuits when not in test mode, and to receive test values during the test mode, wherein the combinatorial logic circuitry is reversible and conservative;
- a set of multiplexers with first inputs coupled to corresponding outputs of the second flip flop circuits, second inputs coupled to corresponding outputs of the combinatorial logic circuitry, and outputs coupled to corresponding inputs of the first set of flip flop circuits;
- wherein when the test mode begins, contents of the first flip flop circuits are transferred to corresponding ones of the second flip flop circuits, output values from the combinatorial logic circuitry are provided to inputs of the first flip flop circuits, and the outputs of the first flip flop circuits are compared to the test values.

19. The processing system of claim 18 wherein:
during a stuck-at test:
- a test state machine is configured to apply a test value of zero to the inputs of the first flip flop circuits and determine whether the test value of zero appears at the outputs of the first flip flop circuits; and
- the test state machine is further configured to apply a test value of one to the inputs of the first flip flop circuits and determine whether the test value of one appears at the outputs of the first flip flop circuits.

20. The processing system of claim 18 wherein:
during a transition test:
- a test state machine is configured to apply a test value of zero to the first flip flop circuits followed by a test value of one, and determine whether the test value of one appears at the outputs of the first flip flop circuits; and
- the test state machine is further configured to apply a test value of one to the inputs of the first flip flop circuits, followed by a zero value, and determine whether the test value of zero appears at the outputs of the first flip flop circuits.

* * * * *